(12) United States Patent
Arechiga

(10) Patent No.: US 10,102,332 B1
(45) Date of Patent: Oct. 16, 2018

(54) GRAPHICAL USER INTERFACE SYSTEM FOR DISPLAYING A PARAMETRIC MODIFICATION OF A VEHICLE MODEL

(71) Applicant: TOYOTA JIDOSHA KABUSHIKI KAISHA, Toyota-shi, Aichi-ken (JP)

(72) Inventor: Nikos Arechiga, San Mateo, CA (US)

( * ) Notice: Subject to any disclaimer, the term of this patent is extended or adjusted under 35 U.S.C. 154(b) by 345 days.

(21) Appl. No.: 15/053,945

(22) Filed: Feb. 25, 2016

(51) Int. Cl.
*G06F 17/50* (2006.01)
*G06F 3/0484* (2013.01)

(52) U.S. Cl.
CPC ...... *G06F 17/5095* (2013.01); *G06F 3/04842* (2013.01)

(58) Field of Classification Search
USPC ................ 703/2, 6; 701/400, 195; 345/190; 706/19
See application file for complete search history.

(56) References Cited

U.S. PATENT DOCUMENTS

| 9,310,216 | B2 * | 4/2016 | MacNeille | G06Q 10/00 |
| 2007/0244677 | A1 * | 10/2007 | Malitski | G06Q 10/047 703/6 |
| 2014/0074391 | A1 * | 3/2014 | Tate, Jr. | B60L 11/1862 701/400 |
| 2015/0260537 | A1 * | 9/2015 | MacNeille | G06Q 10/00 701/400 |

OTHER PUBLICATIONS

Armando Solar-Lezama, "Program Synthesis by Sketching," Dissertation submitted to Engineering-Electrical Engineering and Computer Science in the Graduate Division of the University of California, Berkeley (Fall 2008), pp. 1-214.

* cited by examiner

*Primary Examiner* — Thai Q Phan
(74) *Attorney, Agent, or Firm* — Burbage Law, P.C.; Jon-Michael Burbage; Elizabeth Ruzich

(57) ABSTRACT

The disclosure includes a system, method and tangible memory operable to automatically modify the parameters of a subsystem of a vehicle design such that a given hard constraint about the input-output behavior of the subsystem is guaranteed to hold for all situations where a vehicle built based on the vehicle design is being used in a manner consistent with its intended use. The subsystem may be a software program or a physical component.

25 Claims, 11 Drawing Sheets

$$\min_{k \in K} \|\hat{y} - y_k\| \quad (1)$$
$$\text{s.t. } \forall x, a(x) \geq 0 \Rightarrow \forall x, y(x;a) \cdot q(x;a) \geq 0 \quad (2)$$

$$\forall x, a(x) \geq 0 \Rightarrow \forall x, y(x;a) \cdot q(x;a) \geq 0, \quad (3)$$

$$\forall x, y(x;a) \cdot q(x;a) - sc(x,y) \geq 0 \vee a(x) \geq 0, \quad (4)$$

Figure 4

$$\min_{\hat{k} \in K} |\hat{k} - k| \quad (5)$$
$$\text{s.t.} \ \forall x, y, \hat{k}, \gamma(x,y) - s\alpha(x) \geq 0 \quad (6)$$
$$s \geq 0 \quad (7)$$

505

$$\min_{\hat{k} \in K} |\hat{k} - k| \quad (8)$$
$$\text{s.t.} \ \text{sos}(\gamma(x,y) - s\alpha(x)) \quad (9)$$
$$s \geq 0 \quad (10)$$

605:
$$\min_{k \in K} \|\hat{k} - k\|$$
s.t. $\dot{x} = f(k, x, u)$     (11)
$\forall x \ \alpha(u, x) \geq 0 \Rightarrow \gamma(u, g(k, x)) \geq 0$     (12), (13)

610:
$$\min_{k \in K} \|\hat{k} - k\|$$
s.t. $\dot{x} = f(k, x, u)$     (14)
$\forall x \ \gamma(u, g(k, x)) - sos(u, x)\,\alpha(u, x) \geq 0$     (15), (16)
$s \geq 0$     (17)

Figure 6

$$\frac{\partial B}{\partial x} f(k, x, u) \le 0. \quad (19)$$

805

$$\min_{\hat{k} \in K} \|\hat{k} - k\|  \quad (20)$$
$$\text{s.t.} \quad \forall x. \, \alpha(u, x) \ge 0 \lor B(x) \le 0 \quad (21)$$
$$\forall x. \, \alpha(u, x) \ge 0 \implies \frac{\partial B}{\partial x} f(k, x, u) \le 0 \quad (22)$$
$$\quad (23)$$

$$\min_{\pi \in K} \|\hat{y} - k\|$$  (24)

s.t. $\forall x, \gamma(u, g(k; x))\gamma(u, g(k; x)) \geq 0$  (25)

$\forall x, \dfrac{\partial B}{\partial x} f(k_t, x, u) + s_2 \alpha(u, x) \geq 0$  (26)

$s_1 \geq 0$  (27)

$s_2 \geq 0$  (28)

GRAPHICAL USER INTERFACE SYSTEM FOR DISPLAYING A PARAMETRIC MODIFICATION OF A VEHICLE MODEL

BACKGROUND

The specification relates to a graphical user interface system for displaying a parametric modification of a vehicle model.

Vehicles are designed by design engineers. Design engineers use modeling software for design space exploration of their vehicle designs, including simulation of the performance of different design choices and evaluation of different design alternatives. Examples of modeling software suitable for vehicle design include Modelica platforms such as MapleSim.

Design engineers must check their vehicle designs to determine whether they conform to certain hard constraints. A hard constraint for a vehicle design includes a constraint that must always hold for all situations in which the driver is using the vehicle for its intended purpose. For example, so long as the vehicle is being driven on a public road at speeds that conform with legal limits, the drive shaft should not break in two, and the vehicle should continue to go forward while the accelerator is pressed because the drive shaft is intact.

SUMMARY

Embodiments may include a method, system or non-transitory computer readable medium operable to automatically modify the parameters of a subsystem of a vehicle design such that a given hard constraint about the input-output behavior of the subsystem is guaranteed to hold for all situations where a vehicle built based on the vehicle design is being used in a manner consistent with its intended use. The subsystem may be a software program or a physical component.

Unlike Monte-Carlo analysis, or derivatives thereof, embodiments may include a mathematical proof that verifies that all possible situations have been considered and that the hard constraint holds for each of these situations assuming that the vehicle is being used for its intended purpose.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a method including: building a first vehicle model for a real world vehicle based on vehicle parameter data describing a set of vehicle parameters that describe the real world vehicle, where a subset of the vehicle parameters included in the set of vehicle parameters are included in a set of candidate parameters for parametric modification; performing a reachability analysis to determine whether the first vehicle model satisfies each hard constraint included in a set of hard constraints for all situations where the real world vehicle is being used for its intended purpose; determining, based on the reachability analysis, that the first vehicle model does not satisfy each hard constraint included in the set of hard constraints for all the situations where the real world vehicle is being used for its intended purpose; analyzing, by a processor, the set of candidate parameters for parametric modification to identify a set of options for modifying one or more of the vehicle parameters included in the set of vehicle parameters, where each of the options included in the set of options is configured so that their implementation would result in a modified vehicle model that would satisfy each hard constraint included in the set of hard constraints for all the situations where the real world vehicle is being used for its intended purpose; providing a first graphical user interface that visually displays the set of options; receiving an input from a user identifying a selected option from the set options visually displayed by the first graphical user interface; generating the modified vehicle model based on the selected option, where the modified vehicle model is configured to satisfy each hard constraint included in the set of hard constraints for all the situations where the real world vehicle is being used for its intended purpose; determining a mathematical proof that proves that the modified vehicle model is configured to satisfy each hard constraint included in the set of hard constraints for all the situations where the vehicle is being used for its intended purpose; and providing a second graphical user interface that visually displays the modified vehicle model and the mathematical proof at the same time. Other embodiments of this aspect include corresponding computer systems, apparatus, and computer programs recorded on one or more computer storage devices, each configured to perform the actions of the methods.

One general aspect includes a method including: building a first vehicle model for a real world vehicle based on vehicle parameter data describing a set of vehicle parameters that describe the real world vehicle, where a subset of the vehicle parameters included in the set of vehicle parameters are included in a set of candidate parameters for parametric modification; performing a reachability analysis to determine whether the first vehicle model satisfies each hard constraint included in a set of hard constraints for all situations that include a set of assumptions; determining, based on the reachability analysis, that the first vehicle model does not satisfy each hard constraint included in the set of hard constraints for all the situations that include the set of assumptions; analyzing, by a processor, the set of candidate parameters for parametric modification to identify a set of options for modifying one or more of the vehicle parameters included in the set of vehicle parameters, where each of the options included in the set of options is configured so that their implementation would result in a modified vehicle model that would satisfy each hard constraint included in the set of hard constraints for all the situations that include the set of assumptions; and providing a first graphical user interface that visually displays the set of options. Other embodiments of this aspect include corresponding computer systems, apparatus, and computer programs recorded on one or more computer storage devices, each configured to perform the actions of the methods.

Implementations may include one or more of the following features. The method further including: receiving an input from a user identifying a selected option from the set options visually displayed in the first graphical user interface; determining the modified vehicle model based on the selected option, where the modified vehicle model is configured to satisfy each hard constraint included in the set of hard constraints for all the situations that include the set of assumptions; determining a mathematical proof that proves that the modified vehicle model is configured to satisfy each hard constraint included in the set of hard constraints for all the situations that include the set of assumptions; and providing a second graphical user interface that visually displays the modified vehicle model and the mathematical proof. The method where the set of assumptions includes the real world vehicle being used for its intended purpose. The method where the set of assumptions includes the real world vehicle being used in a manner that is lawful. The method where each hard constraint included in the set of hard constraints is a threshold that should not be exceeded. The method where each first graphical user interface and the second graphical user interface are visually displayed on a monitor. The method where the second graphical user interface visually displays the modified vehicle model and the mathematical proof at the same time. The method where one of the options included in the set of options for modifying one or more of the vehicle parameters includes modifying a physical property of a hardware component included in the set of vehicle parameters. The method where the physical property includes a stiffness of a suspension included in the set of vehicle parameters. The method where one of the options included in the set of options for modifying one or more of the vehicle parameters includes modifying a hardware component and a software component included in the set of vehicle parameters. The method where the method does not include a Monte-Carlo analysis. The method where the method does not include a derivative of a Monte-Carlo analysis. Implementations of the described techniques may include hardware, a method or process, or computer software on a computer-accessible medium.

One general aspect includes a non-transitory memory including computer code which, when executed by a processor, causes the processor to perform steps including: building a first vehicle model for a real world vehicle based on vehicle parameter data describing a set of vehicle parameters that describe the real world vehicle, where a subset of the vehicle parameters included in the set of vehicle parameters are included in a set of candidate parameters for parametric modification; performing a reachability analysis to determine whether the first vehicle model satisfies each hard constraint included in a set of hard constraints for all situations that include a set of assumptions; determining, based on the reachability analysis, that the first vehicle model does not satisfy each hard constraint included in the set of hard constraints for all the situations that include the set of assumptions; analyzing, by a processor, the set of candidate parameters for parametric modification to identify a set of options for modifying one or more of the vehicle parameters included in the set of vehicle parameters, where each of the options included in the set of options is configured so that their implementation would result in a modified vehicle model that would satisfy each hard constraint included in the set of hard constraints for all the situations that include the set of assumptions; and providing a first graphical user interface that visually displays the set of options. Other embodiments of this aspect include corresponding computer systems, apparatus, and computer programs recorded on one or more computer storage devices, each configured to perform the actions of the methods.

Implementations may include one or more of the following features. The non-transitory memory where a first one of the options included in the set of options for modifying one or more of the vehicle parameters includes modifying a hardware component included in the set of vehicle parameters and a second one of the options included in the set of options for modifying one or more of the vehicle parameters includes modifying a software component included in the set of vehicle parameters. The non-transitory memory where the steps do not include a Monte-Carlo analysis. The non-transitory memory where the steps do not include a derivative of a Monte-Carlo analysis. The non-transitory memory where the real world vehicle is an autonomous vehicle. The non-transitory memory where one or more of the set of hard constraints is defined by a governmental regulation. The non-transitory memory where one or more of the set of hard constraints is defined by a standard approved by a standards organization. The non-transitory memory where the steps further include: receiving an input from a user identifying a selected option from the set options visually displayed in the first graphical user interface; determining the modified vehicle model based on the selected option, where the modified vehicle model is configured to satisfy each hard constraint included in the set of hard constraints for all the situations that include the set of assumptions; and providing a second graphical user interface that visually displays the modified vehicle model. The non-transitory memory where the steps further include determining a mathematical proof that proves that the modified vehicle model is configured to satisfy each hard constraint included in the set of hard constraints for all the situations that include the set of assumptions, and where the second graphical user interface visually displays a first image that depicts the modified vehicle model and a second image that depicts the mathematical proof. The non-transitory memory where the second graphical user interface visually displays the first image and the second image at the same time. The non-transitory memory where the second graphical user interface visually displays the first image and the second image in a side by side orientation. The non-transitory memory where the set of options is not generated by randomly sampling different parameter combinations to identify a set of options whose implementation would result in the modified vehicle model that would satisfy each hard constraint included in the set of hard constraints for all the situations that include the set of assumptions. Implementations of the described techniques may include hardware, a method or process, or computer software on a computer-accessible medium.

BRIEF DESCRIPTION OF THE DRAWINGS

The disclosure is illustrated by way of example, and not by way of limitation in the figures of the accompanying drawings in which like reference numerals are used to refer to similar elements.

FIGS. 4 through 9 include example equations that may be used to parametrically modify a first vehicle model to generate a modified vehicle model according to some embodiments.

DETAILED DESCRIPTION

Figure 1:
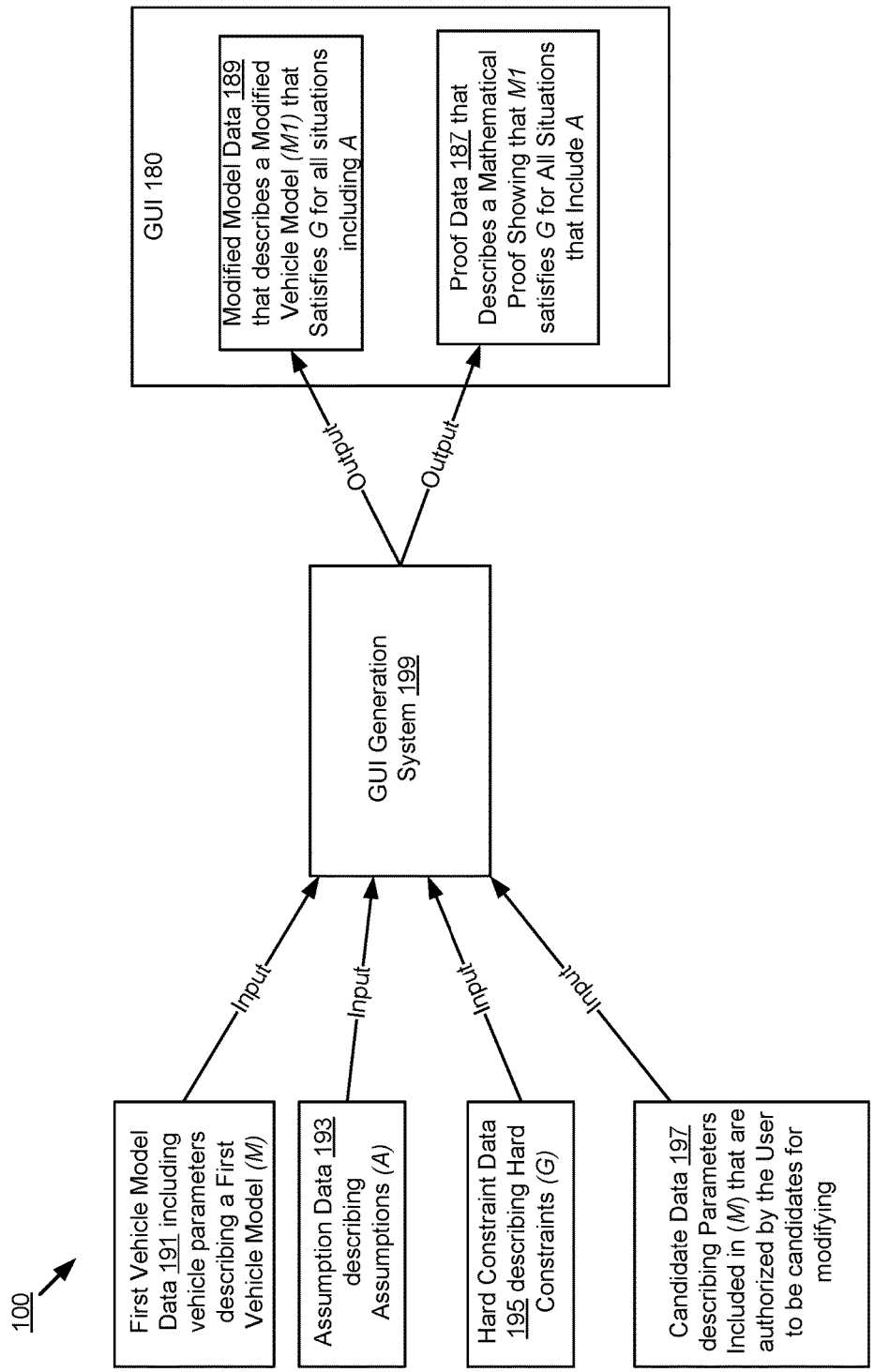
FIG. 1 is a block diagram illustrating an example process flow for a graphical user interface generation system according to some embodiments.

Vehicles are designed by design engineers. Design engineers use modeling software for design space exploration of their vehicle designs, including simulation of the performance of different design choices and evaluation of different design alternatives. Examples of modeling software suitable for vehicle design include Modelica platforms such as MapleSim.

Design engineers must check their vehicle designs to determine whether they conform to certain hard constraints. A hard constraint for a vehicle design includes a constraint that must always hold for all situations in which the driver is using the vehicle for its intended purpose. For example, so long as the vehicle is being driven on a public road at speeds that conform with legal limits, the drive shaft should not break in two, and the vehicle should continue to go forward while the accelerator is pressed because the drive shaft is intact. In some embodiments, a hard constraint may be defined by one or more of at the following: a vehicle manufacturer; a governmental regulation; a governmental statue or law; a standards organization; a factor of safety; an engineering convention or best practice; etc.

Unfortunately, the modeling software packages currently available on the market do not include functionality that allows design engineers to check that hard constraints definitely hold for all situations in which the driver is using the vehicle for its intended purpose. As a result, design engineers currently determine whether their vehicle designs conform to hard constraints using Monte-Carlo analysis, or some derivative thereof.

Monte-Carlo analysis is a broad class of computational algorithms that rely on repeated random sampling to obtain numerical results. Monte-Carlo-based methods may be used to attempt to solve physical or mathematical problems, and are most useful when it is difficult or impossible to use other mathematical methods. Monte-Carlo-based methods are time consuming, and frequently provide unreliable results because they rely on the assumption that a random sampling that is applied long enough will consider every possible outcome. However, this assumption is rarely true.

Accordingly, Monte-Carlo analysis, and all its derivatives, are inadequate for determining whether hard constraints definitely hold for all situations in which the driver is using the vehicle for its intended purpose since it is time consuming and includes no guarantee that all possible situations have been considered.

In some embodiments, the graphical user interface generation system ("GUI generation system") described herein enable a human design engineer to find a value of design parameters such that a hard constraint holds for all situations. Existing solutions such as Monte-Carlo-style analysis do not guarantee that all situations have been considered (and so, these approaches are risky relative to the comprehensiveness of the GUI generation system) and are time consuming for the human design engineer.

These prior art approaches also require the design engineer to use various pieces of software and possibly to convert their data to be compatible among the different software. By contrast, embodiments of the GUI generation system include an end-to-end solution (so multiple pieces of software or data conversion is not required) that enables a design engineer to quickly and easily determine that a hard constraint does not hold for a design for all situations (given certain assumptions) and then provides parametric modification options to the design engineer that will modify the design in a way that guarantees that the hard constraint definitely holds for all situations (given certain assumptions). Since the parametric modification options are based on input from the design engineer, at least one of the options will be acceptable to the design engineer. By contrast, solutions that may include automated generation of parametric modifications options may not provide an option that is acceptable in the judgement of the design engineer, and so, automation in this regard is not desirable.

In some embodiments, the GUI generation system includes a method or system to automatically modify the parameters of a subsystem of a vehicle such that a given hard constraint about the input-output behavior of the subsystem is guaranteed to hold.

In some embodiments, the subsystem may be a software program or a hardware component of the vehicle.

In some embodiments, the GUI generation system provides a mathematical proof arrived at using a reachability analysis that shows that all possible scenarios have been considered and that the hard constraint holds for each of these scenarios and the vehicle can never reach an undesired state so long as it is being used for its intended purpose.

For example, assume that (1) the design engineer has created a model of a vehicle using a modeling software (this model is referred to as a "vehicle model" or a "first vehicle model") by inputting a set of vehicle parameters that define the first vehicle model and that (2) the design engineer wants the vehicle model to behave such that under an assumption, A, the design engineer has a guarantee, G, as shown below:

A=the assumption that the vehicle will be used for its intended purpose.

G=the hard constraint being analyzed.

Assume that the design engineer performs a reachability analysis on the vehicle model (M) to determine whether the guarantee (G) will definitely hold for all conditions that include the assumption (A). Further assume that a reachability analysis shows that the guarantee (G) does not hold. Also assume that when creating the vehicle model (M), the design engineer designated a subset of the vehicle parameters as being among a set of candidate parameters that the design engineer is willing to modify in the event that the guarantee (G) does not hold for all conditions that include the assumption (A).

In some embodiments, the GUI generation system described herein provides the following example benefits that assist the design engineer when the reachability analysis shows that the guarantee (G) does not hold.

First, the GUI generation system provides the design engineer with a graphical user interface (GUI) that displays a set of options for modifying one or more parameters of the design of the vehicle model (M), and each of these options is configured so that their implementation would yield a modified vehicle model (M1) which, if analyzed by reachability analysis, the guarantee (G) will definitely hold for all conditions that include the assumption (A).

Second, the design engineer automatically receives the set of options without the need for calculations and manual labor on the part of the design engineer.

Third, the set of options generated by the GUI generation system are known to be acceptable to the design engineer because they are generated based in part on the set of candidate parameters that the design engineer is willing to modify in the event that the guarantee (G) does not hold for all conditions that include the assumption (A).

In some embodiments, the GUI generation system may include a full end-to-end environment for the modeling and development vehicle designs.

In some embodiments, the GUI generation system is a plugin or submodule of an existing modeling software package that is suitable for modeling vehicle designs.

Example System Overview

FIG. 1 is a block diagram illustrating an example process flow 100 for a GUI generation system 199 according to some embodiments.

The GUI generation system 199 may receive one or more of the following inputs: first vehicle model data 191 including one or more vehicle parameters describing a first vehicle model (M); assumption data 193 describing one or more assumptions (A); hard constraint data 195 describing one or more hard constraints (G); and candidate data 197 describing one or more parameters included in the first vehicle model data 191 that are authorized by a user to be candidates for modifying.

The GUI generation system 199 may provide one or more of the following as outputs: modified vehicle model data 189 that describes a modified model (M1) that satisfies the one or more guarantees (G) for all situations that include the one or more assumptions (A); and proof data 187 that describes a mathematical proof showing that the modified vehicle model satisfies the one or more guarantees (G) for all situations that include the one or more assumptions (A). The modified vehicle model may be visually depicted in a GUI 180. The proof may be visually depicted in the GUI 180. An example of the GUI is described in more detail below with reference to FIG. 10.

In some embodiments, the first vehicle model data 191 may include parameter data describing one or more parameters of a real word vehicle. The first vehicle model (M) may include a virtual model generated by a modeling software that is suitable for vehicle design. The first vehicle model (M) may be a virtual model for the real world vehicle. For example, the vehicle parameter data may be inputted to a modeling software. The modeling software may generate the first vehicle model data 191 based on the vehicle parameter data.

The GUI generation system 199 may include code and routines operable to receive one or more of the first vehicle model data 191, the assumption data 193, the hard constraint data 195 and the candidate data 197 and output a GUI 180 including the modified vehicle model (M1) and the proof showing that the modified vehicle model (M1) satisfies the one or more guarantees (G) for all situations that include (A).

In some embodiments, the GUI generation system 199 may include the modeling software. The modeling software may include a Modelica platform. For example, the modeling software may include MapleSim.

In some embodiments, the GUI generation system 199 may be a plug-in or submodule of the modeling software.

In some embodiments, the GUI generation system 199 may receive the vehicle parameter data from a human user of the GUI generation system 199. The human user of the GUI generation system 199 may include a design engineer. While inputting the vehicle parameter data the user may designate one or more of the vehicle parameters are being included in the candidate data 197. The GUI generation system 199 may generate the first vehicle model data 191 based on the vehicle parameter data. The GUI generation system 199 may store the first vehicle model data 191 in a non-transitory memory (such as the memory 227 described below with reference to FIG. 2). The user may desire to test whether the vehicle model described by the first vehicle model data 191 holds for one or more hard constraints (G) described by the hard constraint data 195 for all situations that include the one or more assumptions described by the assumption data 193.

In some embodiments, the GUI generation system 199 may retrieve the first vehicle model data 191 from the non-transitory memory. The user may provide the assumption data 193 and the hard constraint data 195 as inputs. For example, the user may use a keyboard, mouse, trackpad, microphone (i.e., voice dictation), camera, etc. that is communicatively coupled to the GUI generation system 199 to provide the assumption data and the hard constraint data 195 as inputs. Optionally, one or more of the assumption data 193 and the hard constraint data 195 may be stored on the non-transitory memory of the GUI generation system 199 or hard coded in software included in the GUI generation system 199.

The GUI generation system 199 may perform a reachability analysis on the first vehicle model described by the first vehicle model data 191. The results of the reachability analysis may indicate whether each hard constraint (G) described by the hard constraint data 195 is satisfied for all the situations including the one or more assumptions described by the assumption data 193.

A reachability analysis may include a process of determining a set of reachable states for the real world vehicle represented by a vehicle model (e.g., the first vehicle model or the modified vehicle model). The reachability analysis is described in more detail below with reference to FIGS. 4-9.

The reachability analysis may indicate that the first vehicle model does not satisfy each hard constraint (G) described by the hard constraint data 195 for all the situations including the one or more assumptions described by the assumption data 193.

The GUI generation system 199 may analyze the candidate parameters described by the candidate data 197 to identify a set of options for modifying one or more of the vehicle parameters included in the first vehicle model data 191. Each of the options included in the set of options may be configured so that their implementation would result in a different modified vehicle model (M1) that satisfies each hard constraint (G) included in the hard constraint data 195 for all the situations that include the one or more assumptions described by the assumption data 193. The analysis that provides the set of options for modifying the vehicle parameters included in the first vehicle model data 191 is described in more detail below with reference to FIGS. 4-9.

In some embodiments, since set of options is generated based on the candidate parameters provided by the user, the user is guaranteed to approve of one of the options included in the set.

The GUI generation system 199 may generate graphical data for providing a first GUI to the user. The first GUI may be displayed on a monitor that is communicatively coupled to the GUI generation system 199. The first GUI may visually display the set of options for modifying the vehicle parameters included in the first vehicle model data 191.

The GUI generation system 199 may receive receiving an input from the user identifying a selected option from the set options visually displayed by the first GUI. For example, the user may select one of the options and provide an input to the GUI generation system to identify which of the options they have selected.

The GUI generation system 199 may generate the modified vehicle model (M1) based on the selected option. The modified vehicle model (M1) may be described by the modified vehicle model data 189. The modified vehicle model data 189 may be identical to the first vehicle model data 191 with the exception that one or more of the vehicle parameters included in the first vehicle model data 191 are modified based on the option selected by the user via the first GUI. The modified vehicle model (M1) may be configured to satisfy each hard constraint (G) described by the hard constraint data 195 for all the situations including the one or more assumptions described by the assumption data 193.

The GUI generation system 199 may determine a mathematical proof described by the proof data 187. The mathematical proof may prove that the modified vehicle model (M1) is configured to satisfy each hard constraint (G) described by the hard constraint data 195 for all the situations including the one or more assumptions described by the assumption data 193.

The GUI generation system 199 may generate graphical data for providing a second GUI (i.e., the GUI 180) that visually displays the modified vehicle model and the mathematical proof.

In some embodiments, the second GUI may visually display the modified vehicle model and the mathematical proof at the same time.

In some embodiments, the second GUI may visually display the modified vehicle model and the mathematical proof side-by-side at the same time.

In some embodiments, the one or more assumptions (A) described by the assumption data 193 may include the assumption that the real world vehicle resented by the vehicle model (e.g., the first vehicle model or the modified vehicle model) is being used for its intended purpose. For example, the driver's use of the real world vehicle represented by the vehicle model may meet one or more of the following criteria: the real world vehicle is used in a manner that is lawful; the real world vehicle is used in a manner that is consistent with federal, state and local laws; the real world vehicle is driven on a roadway and not off roads; the real world vehicle is used in a non-negligent manner; the real word vehicle is used in a non-reckless manner; the real world vehicle is used in a manner that is consistent with the vehicle manual provided by the manufacturer of the real world vehicle; the real world vehicle is maintained in a manner that is consistent with the vehicle manual provided by the manufacturer of the real world vehicle; the real world vehicle is maintained in a manner that is consistent with federal, state and local regulations; the real world vehicle is used and maintained in a manner that is consistent with any recall notices provided in writing by the vehicle manufacturer; and the real world vehicle is used and maintained in a manner that is consistent with any cautions or warnings provided in writing by the vehicle manufacturer.

In some implementations, the GUI generation system 199 can be implemented using hardware including a field-programmable gate array ("FPGA") or an application-specific integrated circuit ("ASIC"). In some other implementations, the GUI generation system 199 can be implemented using a combination of hardware and software. The GUI generation system 199 may be stored in a combination of the devices and servers, or in one of the devices or servers. The GUI generation system 199 may include code and routines configured to perform one or more steps of the method 300 described below with reference to FIGS. 3A and 3B when executed by a processor, such as processor 225, described below with reference to FIG. 2.

Example Electronic Devices

Figure 2:
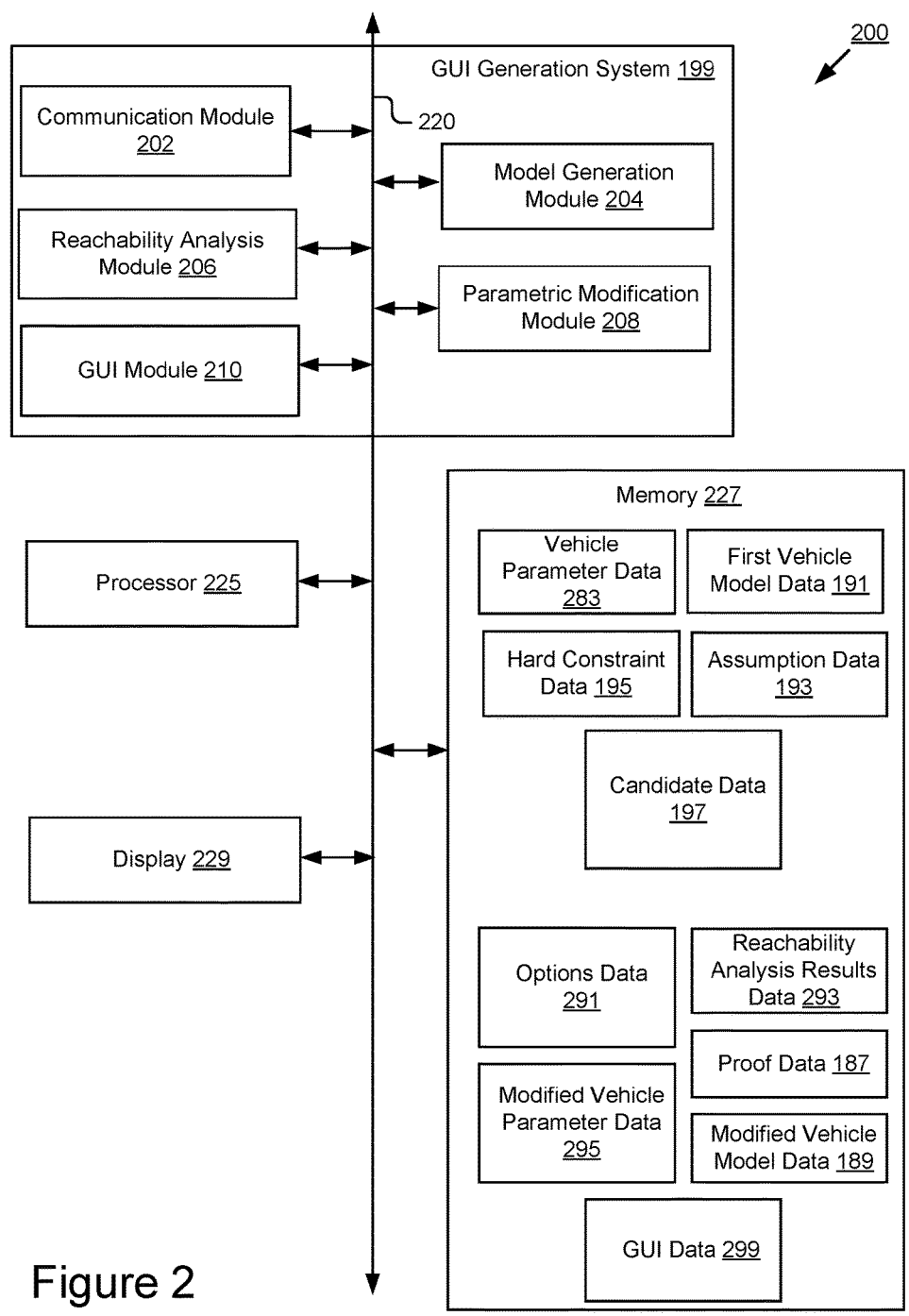
FIG. 2 is a block diagram illustrating an example computer system including a graphical user interface generation system according to some embodiments.

FIG. 2 is a block diagram illustrating an example computing device 200 including the GUI generation system 199 according to some embodiments. In some implementations, the GUI generation system 199 may include an electronic device programmed or configured to perform one or more blocks of the method 300 described below with reference to FIGS. 3A and 3B. In some implementations, the GUI generation system 199 may include a special-purpose computing device configured to provide some or all of the functionality described above with reference to the GUI generation system 199 or below with reference to method 300 described below with reference to FIGS. 3A and 3B.

The computing device 200 may include one or more of the following elements: the GUI generation system 199; a processor 225; a memory 227; and a display 229. The components of the computing device 200 are communicatively coupled by a bus 220. In some embodiments, the components of the computing device 200 are local to the same hardware so that the bus 220 is not necessary for communication among the components of the computing device 200. In some embodiments, communication structures or methods other than the bus 220 may be implemented.

The processor 225 includes an arithmetic logic unit, a microprocessor, a general-purpose controller, or some other processor array to perform computations and provide electronic display signals to a display device. The processor 225 processes data signals and may include various computing architectures including a complex instruction set computer (CISC) architecture, a reduced instruction set computer (RISC) architecture, or an architecture implementing a combination of instruction sets. Although FIG. 2 includes a single processor 225, multiple processors 225 may be included. The processor 225 may include a graphical processing unit. Other processors, operating systems, sensors, displays, and physical configurations may be possible.

The display 229 is an electronic device configured for the visual presentation of data. For example, the display 229 may be configured for the visual presentation of the GUI data 299. The display 229 may receive the GUI data 299 and output a GUI.

The memory 227 is a tangible or non-transitory storage medium that stores instructions or data that may be accessed and executed by the processor 225. The instructions or data may include code for performing the techniques described herein. The memory 227 may include a dynamic random access memory (DRAM) device, a static random access memory (SRAM) device, flash memory, or some other memory device. In some implementations, the memory 227 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

The memory 227 may include one or more of the following elements: vehicle parameter data 283; first vehicle model data 191; hard constraint data 195; assumption data 193; candidate data 197; options data 291; reachability analysis results data 293; modified vehicle parameter data 295; proof data 187; modified vehicle model data 189; and GUI data 299. The following elements were described above with reference to FIG. 1, and so, their descriptions will not be repeated here: first vehicle model data 191; assumption data 193; hard constraint data 195; proof data 187; and modified vehicle model data 189.

The vehicle parameter data 283 may describe one or more vehicle parameters for the real world vehicle represented by a vehicle model. For example, the vehicle parameter data 283 may include the vehicle parameters for the real world vehicle represented by the first vehicle model described by the first vehicle model data 191 or the modified vehicle model described by the modified vehicle model data 189.

In some embodiments, the vehicle parameter data 283 may be a subset of the first vehicle model data 191.

In some embodiments, the vehicle parameter data 283 may describe one or more of the following: suspension of a vehicle; kinematics of the vehicle; compliances of the vehicle; rollover thresholds of the vehicle; inertias of the vehicle; mass center locations of the vehicle; and software specifications of the vehicle.

In some embodiments, the vehicle parameter data 283 may include any data necessary for the model generation module 204 to provide its functionality. For example, the vehicle parameter data 283 may include all the inputs necessary to generate a vehicle model that represents the real world vehicle that is designed by the user of the GUI generation system 199.

The reachability analysis results data 293 may include a description of the results of a reachability analysis performed on the first vehicle model described by the first vehicle model data 191.

The candidate data 197 may be a subset of the vehicle parameter data 283. The candidate data may include parameters included in the vehicle parameter data 283 which a user (e.g., a design engineer) has digitally indicated as acceptable for modification if the reachability analysis of the first vehicle model fails (e.g., at least one hard constraint fails for a situation including the one or more assumptions).

The modified vehicle parameter data 295 may include a description of the vehicle parameters after they have been modified based on a selected option. The modified vehicle parameter data 295 may describe the vehicle parameters that are used to generate the modified vehicle model described by the modified vehicle model data 189. For example, the user selects an option from the options data 291. The selected option includes one or more new values for one or more of the candidate parameters that are a subset of the vehicle parameter data 283. The modified vehicle parameter data 295 includes the vehicle parameters for the first vehicle model after they have been modified to include the one or more new values described by the selected option. The model generation module 204 may the generate the modified vehicle model based on the modified vehicle parameter data 295.

The options data 291 may include a description of the set of options for modifying one or more of the vehicle parameters described by the vehicle parameter data 283. In some embodiments, one or more of the options included in the set of options is configured so that their implementation would result in a modified vehicle model that would satisfy each hard constraint included in the hard constraint data 195 for all the situations that include the one or more assumptions described by the assumption data 193.

In some embodiments, the options data 291 may include one or more options for modifying a physical property of a hardware component included in the set of vehicle parameters described by the vehicle parameter data 283. For example, the set of vehicle parameters described by the vehicle parameter data 283 may specify a certain hardware component be included in the vehicle model and the options data 291 may include substituting a different hardware component for the specified hardware component.

In some embodiments, the physical property modified by the options data 291 may include an attribute of a hardware component. For example, a first suspension described by a vehicle parameter included in the set of vehicle parameters may have stiffness indicated by a stiffness property described by the vehicle parameter data 283. The options data 291 may include an option that indicates that a second suspension having a different stiffness may be substituted for the first suspension. The different stiffness of the second suspension may contribute to a guarantee being satisfied that was previously not satisfied by the stiffness of the first suspension.

In some embodiments, the options data 291 may include one or more options for modifying a software component operable on the real world vehicle represented by the first vehicle model. For example, the set of vehicle parameters described by the vehicle parameter data 283 may indicate a first software component be installed and operable on the real world vehicle represented by the first vehicle model. The options data 291 may include an option that indicates that a second software component may be substituted for the first software component. The second software component may have a different software specification than the first software component, and this different specification may contribute to a guarantee being satisfied that was previously not satisfied by the specification of the first software component. In some embodiments, the real world vehicle being modeled is an autonomous vehicle and the software component being modified may include the software for the autonomous vehicle.

In some embodiments, the different options described by the options data 291 are not generated by randomly sampling different combinations of vehicle parameters to identify a set of options whose implementation would result in a modified vehicle model that would satisfy each hard constraint included in the set of hard constraints for all situations that include the set of assumptions. For example, such random sampling of different combinations of vehicle parameters is an element of a Monte-Carlo analysis, and such analysis is not capable of considering all situations since it is reliant on random sampling, and random sampling can never guarantee that all situations have been considered.

In some embodiments, the modified reachability analysis results data 293 may include the results of a set of reachability analysis performed for each option included in the set of options described by the options data 291. In this way, the GUI generation system 199 may guarantee that the one or more of the options included in the set of options described by the options data 291 is configured so that their implementation would result in a modified vehicle model that would satisfy each hard constraint included in the hard constraint data 195 for all the situations that include the one or more assumptions described by the assumption data 193.

The GUI data 299 may include graphical data for depicting a GUI. For example, the GUI data may include graphical data for depicting one or more of the first GUI and the second GUI described above with reference to FIG. 1. The GUI 180 depicted in FIG. 10 may be generated based on the GUI data 299.

In some implementations, the GUI generation system 199 includes one or more of the following: a communication module 202; a model generation module 204; a reachability analysis module 206; a parametric modification module 208; and a GUI module 210.

The communication module 202, model generation module 204, reachability analysis module 206, parametric modification module 208 and GUI module 210 are communicatively coupled to the bus 220.

The communication module 202 may include code and routines configured to handle communications between the GUI generation system 199 and other components of the computing device 200. In some implementations, the communication module 202 can be stored in the memory 227 of the computing device 200 and can be accessible and executable by the processor 225.

In some embodiments, the communication module 202 receives data from components of the GUI generation system 199 and stores the data in the memory 227. For example, the communication module 202 receives the reachability analysis results data 293 from the reachability analysis module 206 and stores the reachability analysis results data 293 in the memory 227.

The model generation module 204 may include code and routines configured to generate a virtual model of a real world vehicle. For example, the model generation module 204 may receive the vehicle parameter data 283 describing one or more parameters for a real world vehicle and generate a virtual model for the real world vehicle. In some embodiments, the virtual model is described by the first vehicle model data 191 or the modified vehicle model data 189.

In some implementations, the model generation module 204 can be stored in the memory 227 of the computing device 200 and can be accessible and executable by the processor 225.

In some embodiments the model generation module 204 may include a modeling software such as MapleSim (produced by Maplesoft of Waterloo, Ontario) or some other Modelica platform.

In some embodiments, the model generation module 204 is a separate element of the computing device 200. For example, the model generation module 204 is a modeling software suitable for vehicle design and the modeling software is installed on a computer and operable by the processor 225 of the computer. The GUI generation system 199 may be a plug-in installed in the model generation module 204. In this way, the GUI generation system 199 may be configured to improve the performance of the modeling software by providing the benefits described herein.

The reachability analysis module 206 may include code and routines configured to perform a reachability analysis on one or more of the first vehicle model data 191 and the modified vehicle model data 189. The reachability analysis is described in more detail below with reference to FIGS. 4-9. The reachability analysis module 206 may be stored in the memory 227.

In some embodiments, the reachability analysis provided by the reachability analysis module 206 may determine whether a vehicle model satisfies one or more hard constraints for all situations that include one or more assumptions. The vehicle model may include the first vehicle model described by the first vehicle model data 191 or the modified vehicle model described by the modified vehicle model data 189.

In some embodiments, the reachability analysis may include analytically dividing the vehicle module into a plurality of subsystems. The reachability analysis may include associating one or more guarantees with the different subsystems. The one or more guarantees may include one or more hard constraints that must be satisfied by the subsystem that is associated with the one or more guarantees. The reachability analysis may determine a contract for each subsystem. The contract may include the subsystem satisfying the guarantee for all situations that include the one or more assumptions. If the contract is not satisfied, then the parametric modification module 208 may determine which of the one or more parameters affected the negative outcome and, of these parameters, which are included in the candidate parameters that may be modified.

The parametric modification module 208 may include code and routines configured to analyze a vehicle model, and optionally the results of the reachability analysis, to determine which candidate parameters included in the vehicle model may be modified to form a modified vehicle model that would satisfy one or more guarantees for all situations that include the one or more assumptions.

In some embodiments, the parametric modification module 208 may determine one or more options for modifying the candidate parameters. For example, an option may include a first value for a first candidate parameter may be modified to a second value. The option may include the current values for other candidate parameters being modified to new values. The parametric modification module 208 may repeat this process may a plurality of times for different combinations of candidate parameters to form a set of options for modifying the vehicle parameters for the first vehicle model. Each of the options may be configured by the parametric modification module 208 so that their implementation would result in a modified vehicle model that would satisfy the one or more guarantees for all situations that include the one or more assumptions. The one or more options may be stored in the memory 227 as the options data 291.

In some embodiments, parametric modification module 208 identify the candidate parameters and create the one or more options by performing an optimization analysis. Examples of the optimization analysis are described below with reference to FIGS. 4-9 according to some embodiments.

The parametric modification module 208 may include code and routines configured to generate a mathematical proof that proves that a modified vehicle model satisfies one or more hard constraints for each situation that includes the one or more assumptions. The parametric modification module 208 may use one or more of the equations described below with reference to FIGS. 4-9 to generate the proof. The proof may be described by the proof data 187.

The GUI module 210 may include code and routines configured to generate one or more of the GUIs described herein. In some embodiments, the GUI module 210 may be stored in the memory 227.

In some embodiments, a user may want to build a first vehicle model. The user may input one or more vehicle parameters for the first vehicle model via a GUI generated by the GUI module 210 for that purpose. The GUI may include one or more graphical elements (e.g., one or more fields) for inputting the one or more vehicle parameters for the first vehicle model. The GUI may also include one or more graphical elements that the user may use to identify which of the one or more vehicle parameters are included in the set of candidate parameters described by the candidate data 197. The communication module 202 may store the one or more vehicle parameters as vehicle parameter data 283 in the memory 227. The communication module 202 may store the one or more candidate parameters as candidate data 197 in the memory 227. The model generation module 204 may generate the first vehicle model based on the one or more vehicle parameters provided by the user. The model generation module 204 may receive the one or more vehicle parameters described by the vehicle parameters data 283 as inputs and output the first vehicle model described by the first vehicle model data 191. The communication module 202 may store the first vehicle model data 191 in the memory 227.

In some embodiments, the user may want to test the first vehicle model. The GUI module 210 may provide a GUI including one or more graphical elements that the user may use to select the first vehicle model and provide an input directing that the GUI generation system 199 to perform a reachability analysis on the first vehicle model to determine whether it satisfies one or more hard constraints for all situations that include the one or more assumptions. The reachability analysis module 206 may perform the reachability analysis of the first vehicle model. The results of the reachability analysis may be described by the reachability analysis results data 293. The results may indicate that the first vehicle model does not satisfy the one or more guarantees for all situations that include the one or more assumptions. The reachability analysis module 206 may provide a signal to one or more of the parametric modification module 208 and the GUI module 210 indicating the results of the reachability analysis for the first vehicle model. The GUI module 210 may provide a GUI to the user to visually depict the results of the reachability analysis. The parametric modification module 208 may analyze the candidate parameters included in the vehicle parameter data 283 for the first vehicle model. The parametric modification module 208 may generate one or more options for modifying the first vehicle model based on the candidate parameters. For example, the one or more options may include new values for one or more candidate parameters. In some embodiments an option may be achieved by changing the value of just one candidate parameter, whereas other options may include a plurality of candidate parameters being assigned new values. The new values for the one or more options may be configured so that their implementation (e.g., replacing the old value for the candidate parameter with a new value) would result in a modified vehicle model that satisfies the one or more hard constraints for each situation that include the one or more assumptions. The one or more options may form a set of options. The set of options may be stored in the memory 227 by the communication module 202 as the options data 291. The GUI module 210 may provide the user with a GUI that visually depicts the set of options and one or more graphical elements for selecting one of the options included in the set of options. The communication module 202 may receive a selection of one of the one or more options from the set of options, which may now be referred to as the selected option. The selected option includes one or more candidate parameters and new values for the one or more candidate parameters. The parametric modification module 208 may retrieve the vehicle parameter data 283 for the first vehicle model. The parametric modification module 208 may modify the candidate parameters included in the vehicle parameter data 283 for the first vehicle model so that the old values for the one or more candidate parameters included in the selected option are replaced with the new values for the one or more candidate parameters included in the selected option. The parametric modification module 208 may store the resulting set of vehicle parameters as modified vehicle parameter data included in the modified vehicle model data 189. The parametric modification module 208 may determine a proof that proves that the modified vehicle module satisfies the one or more hard constraints for each situation that include the one or more assumptions. The GUI module 210 may determine GUI data 299 for displaying a GUI that visually displays one or more of the modified vehicle module and the proof. The GUI module 210 may provide the GUI data 299 to the display 229 for displaying the GUI. The display 229 may display the GUI based on the GUI data 299.

In some embodiments, the one or more options may be ranked based on one or more of the following: which option would result in a higher profit margin; which option would result in a lower vehicle price; which option would result in the higher vehicle performance; which option would result in a safer vehicle performance; and which option would result in a longer vehicle service life. The first GUI may display the options in a ranked order.

Example Methods

Figure 3A:
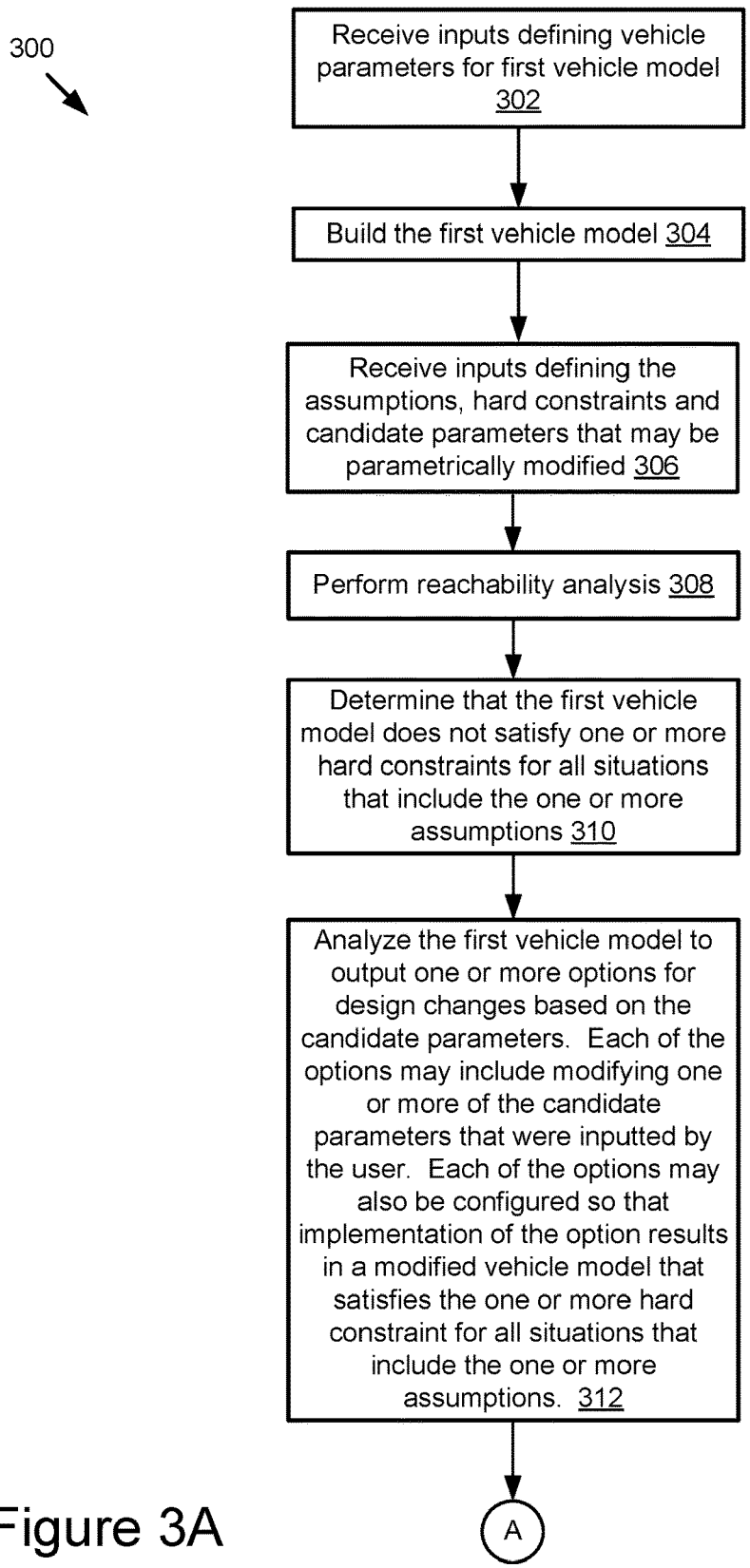
FIGS. 3A and 3B are a flowchart of an example method for generating a graphical user interface that includes a depiction of a modified vehicle model generated by parametrically modifying a first vehicle model, according to some embodiments.
Figure 3B:
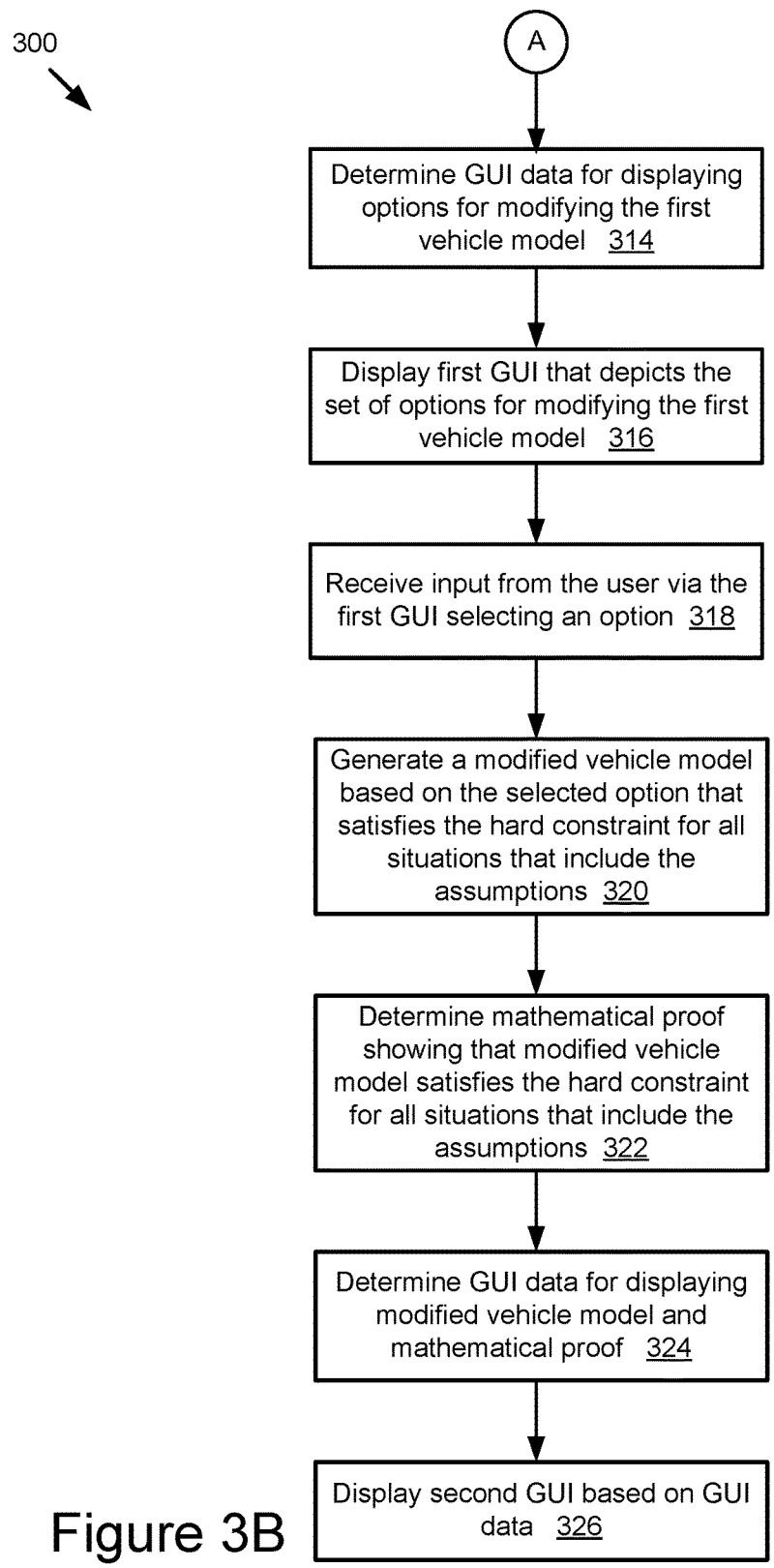

FIGS. 3A and 3B are a flowchart of an example method 300 for generating a virtual environment for testing an automobile design.

At step 302 one or more inputs may be received defining one or more vehicle parameters. The vehicle parameters may be associated with a first vehicle model.

At step 304 a first vehicle model is built. The first vehicle model may be built based on the one or more vehicle parameters.

At step 306 one or more inputs may be received defining one or more assumptions, one or more hard constraints and one or more candidate parameters.

At step 308 a reachability analysis may be performed. The results of the reachability analysis may indicate whether the first vehicle model satisfies one or more of the hard constraints for each situation that includes the one or more assumptions.

At step 310 a determination may be made that the first vehicle model does not satisfy one or more of the hard constraints for each situation that includes the one or more assumptions. For example, a hard constraint may not hold for a situation in which a virtual vehicle built based on the first vehicle model is being used for its intended purpose.

At step 312, the first vehicle model may be analyzed to output one or more design changes based on the candidate parameters that may be parametrically modified to present the user with one or more options for modifying the first vehicle model. Each of the options may include modifying one or more of the candidate parameters that were inputted in step 306. Each of the options may be configured so that the one or more hard constraints is satisfied for all situations that include the one or more assumptions. The one or more options may form a set of options.

Referring now to FIG. 3B, at step 314 GUI data may be determined for displaying the set of options for modifying the first vehicle model.

At step 316, the first GUI that depicts the set of options may be displayed.

At step 318, an input may be received including a selection of one option from the set of options.

At step 320 a modified vehicle model may be generated based on the selected option that satisfies the hard constraint for all situations that include the one or more assumptions.

At step 322 a mathematical proof may be determined. The mathematical proof may prove that the one or more hard constraints are satisfied for all situations that include the one or more assumptions.

At step 324 GUI data may be determined for displaying a second GUI that includes the modified vehicle model and the mathematical proof.

At step 326, the second GUI may be displayed based on the GUI data.

Example Analysis

FIGS. 4 through 9 include example equations that may be used to parametrically modify a first vehicle model to generate a modified vehicle model according to some embodiments.

The real world vehicle represented by the vehicle model (e.g., the first vehicle model or the modified vehicle model) may be analyzed as a combination of one or more subsystems. There may be two types of subsystems included in the vehicle model: a discrete subsystem; and a continuous subsystem. These two types of subsystems may be analyzed separately.

In some embodiments, a discrete subsystem may include a subsystem of a vehicle (or a vehicle model) with a countable number of states.

In some embodiments, a continuous subsystem may include a subsystem of a vehicle (or a vehicle model) with an uncountable number of states.

Each subsystem of the first may be assigned a contract. The contract may include a guarantee that a hard constraint is satisfied for all situations that include the one or more assumptions. For example, the contract may include the guarantee that the hard constraint assigned to the subsystem is satisfied for all situations in which the vehicle is being used for its intended purpose.

An example of a reachability analysis and parametric modification for a discrete subsystem is now described according to some embodiments.

A discrete subsystem may include an input vector x from an input set X, an output vector y from an output set Y and a parameter vector k from a parameter set K (e.g., the set of vehicle parameters for the first vehicle model).

In some embodiments, the action of the discrete subsystem may be modeled by the function g: K×X→Y, so that the parameter value k and the input x, the output of the discrete subsystem is y=g(k, x).

The contract for the discrete subsystem may be given by $(\alpha(x), \gamma(x, y))$, where $\alpha$ represents the one or more assumptions (e.g., as described by the assumption data 193) and $\gamma$ represents the one or more guarantees (e.g., as described by the hard constraint data 195).

The one or more assumptions (e.g., as described by the assumption data 193) for the discrete subsystem may be given by the function $\alpha$: X→R such that $\alpha(x) \geq 0$ if x satisfies the input assumption and is negative otherwise.

The one or more guarantees (e.g., as described by the hard constraint data 195) for the discrete subsystem may be given by the function $\gamma$: X×Y→R such that $\gamma(x, y) \geq 0$ if (x, y) satisfies the guarantee, and is negative otherwise.

The contract for the discrete subsystem may include the requirement that, for any input x to the discrete subsystem that satisfies $\alpha \geq 0$, the output y of the discrete subsystem must satisfy the function $\gamma(x, y) \geq 0$.

In some embodiments, the first vehicle model may include one or more discrete subsystems (each subsystem having at least one contract associated with it), and the reachability analysis performed by the GUI generation system 199 (e.g., by the reachability analysis module 206) may include analyzing each contract for each discrete subsystem of the vehicle model (e.g., the first vehicle model described by the first vehicle model data 191) to determine whether the function for the contract, $\gamma(x, y) \geq 0$, is satisfied for all situations where the input to the discrete subsystem satisfies $\alpha \geq 0$.

If a contract is violated for a discrete subsystem, then the candidate parameters may be analyzed by the GUI generation system 199 to determine one or more options for modifying the vehicle model by modifying one or more values for the candidate parameters so that the contract will no longer fail.

If a parameter value (e.g., a value included in the vehicle parameters described by the candidate data 197) $\hat{k} \in K$ for one or the candidates is determined by the parametric modification module 208 to cause the vehicle model to violate a contract, the parametric modification module 208 may determine a new value for the candidate parameter by applying the first optimization problem 405 depicted in FIG. 4.

In some embodiments, the implication constraint may not be handled by typical optimization methods. Instead, the parametric modification module 208 may use an s-procedure to convert an implication 410 to a single constraint. The implication 410 is shown in FIG. 4.

In some embodiments, a sufficient condition 415 for the implication 410 to hold is shown in FIG. 4.

For example, assume that the sufficient condition 415 holds. It then follows that $\gamma(x, y) \geq s\alpha(x)$. Now assume that the antecedent of the implication 410 holds, so that $\alpha(x) \geq 0$. If so, then $s\alpha(x) \geq 0$, since $s \geq 0$. Since $\gamma(x, y) \geq s\alpha(x) \geq 0$, then $\gamma(x, y) \geq 0$, which is the consequent of the implication 410 shown in FIG. 4. Accordingly, in some embodiments, whenever the sufficient condition 415 holds, so does the implication 410.

Referring now to FIG. 5, a second optimization problem 505 is shown. The second optimization problem 505 is the result of simplifying the first optimization problem 405 based on an understanding that the implication 410 holds whenever the sufficient condition 415 holds. Accordingly, in some embodiments the parametric modification module 208 may use the second optimization problem 505 to identify one or more new values for the candidate parameters.

In some embodiments, the parametric modification module 208 may solve the second optimization problem 505 by relaxing a universally quantified constraint to a sum-of-squares constraint or to a semi-definite constraint.

For example, using the sum-of-squares constraint results in the third optimization problem 510 depicted in FIG. 5.

Referring now to FIG. 6, examples of parametric modification for continuous subsystems is now described according to some embodiments.

A continuous subsystem may be modeled having an input u from an input space U, a continuously evolving continuous state x from a state space X, and an output y from an output space Y.

In some embodiments, the action of the continuous subsystem may be given by the continuous evolution $\dot{x} = f(k, x, u)$ and by an output equation $y = g(k, x)$.

In some embodiments, for every candidate parameter $k \in K$ of the continuous subsystem, the function $f$: K×X×U→X is assumed to satisfy the Lipschitz condition on x and piecewise continuity on u to ensure existence and uniqueness of solutions.

The contract for the continuous subsystem may be given by $(\alpha(u, x), \gamma(u, y))$, where $\alpha$ represents the one or more assumptions (e.g., as described by the assumption data 193) and $\gamma$ represents the one or more guarantees (e.g., as described by the hard constraint data 195).

The one or more assumptions (e.g., as described by the assumption data 193) for the continuous subsystem may be given by the function $\alpha$: U×X→R.

The one or more guarantees (e.g., as described by the hard constraint data 195) for the continuous subsystem may be given by the function $\gamma$: U×Y→R.

The contract for the continuous subsystem may include the requirement that, for any input u to the continuous subsystem that satisfies $\alpha(u, x) \geq 0$ (where x is the current state of the continuous subsystem), the output y of the continuous subsystem must satisfy the function $\gamma(u, y) \geq 0$.

In some embodiments, the first vehicle model may include one or more continuous subsystems (each subsystem having at least one contract associated with it), and the reachability analysis performed by the GUI generation system 199 (e.g., by the reachability analysis module 206) may include analyzing each contract for each continuous subsystem of the vehicle model (e.g., the first vehicle model described by the first vehicle model data 191) to determine whether the function for the contract, $\gamma(u, y) \geq 0$, is satisfied for all situations where the input to the continuous subsystem satisfies $\alpha(u, x) \geq 0$.

If a contract is violated for a continuous subsystem, then the candidate parameters may be analyzed by the GUI generation system 199 to determine one or more options for modifying the vehicle model by modifying one or more values for the candidate parameters so that the contract will no longer fail.

If a parameter value (e.g., a value included in the vehicle parameters described by the candidate data 197) $\hat{k} \in K$ for one or the candidates is determined by the parametric modification module 208 to cause the vehicle model to violate a contract, the parametric modification module 208 may determine a new value for the candidate parameter by applying the fourth optimization problem 605 depicted in FIG. 6.

The parametric modification module 208 may use an s-procedure to remove the implication, similar to what was described above for the discrete subsystem. The result is the fifth optimization problem 610 depicted in FIG. 6.

Accordingly, in some embodiments the parametric modification module 208 may use the fifth optimization problem 610 to identify one or more new values for the candidate parameters. The new values may be configured so that the contract, $\gamma(u, y) \geq 0$, is satisfied for all situations where the input to the continuous subsystem satisfies $\alpha(u, x) \geq 0$.

Figure 7:
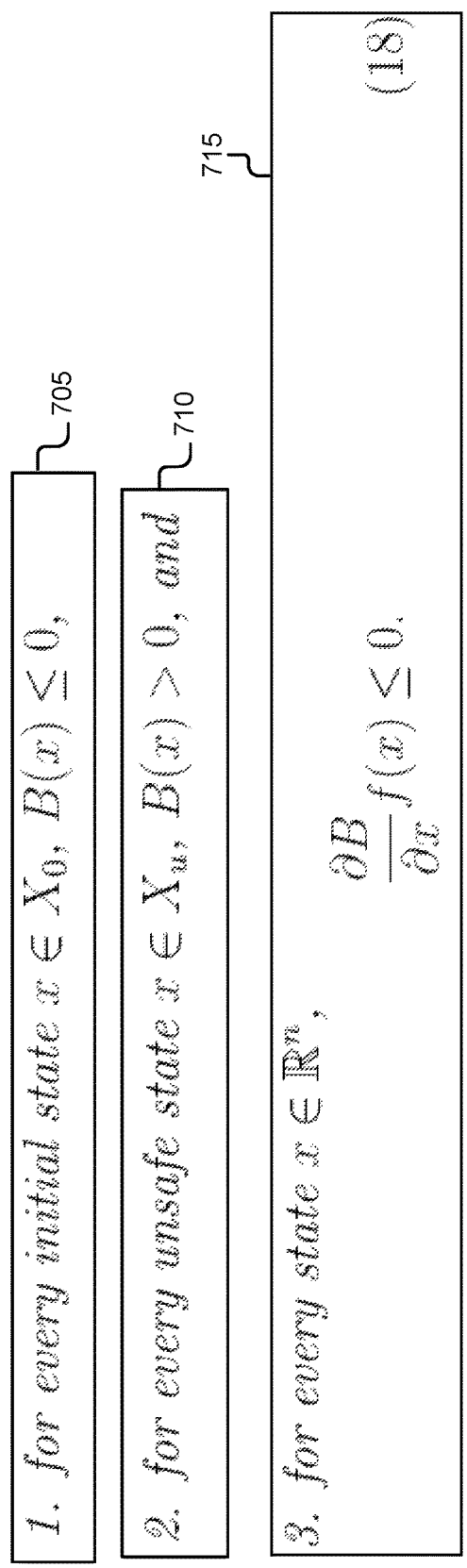

Referring now to FIG. 7, the fifth optimization problem 610 includes a continuously evolving constraint, and so, the fifth optimization problem 610 is a dynamic optimization problem that cannot be solved using one of the standard methods of static optimization. Accordingly, the parametric modification module 208 may include codes and routines configured to identify correct conditions (e.g., a value for the candidate parameter where the contract is satisfied) using one or more barrier certifications to simplify the fifth optimization problem 610 from a dynamic optimization problem to a static optimization problem.

One or more of the guarantees included in the contract may be converted by the parametric modification module 208 to a form that includes one or more logical compositions of one or more barrier certificates.

For the purpose of clarity, only the convex characterization of barrier certificates is described herein. For example, let $X_0 \subset R^n$ be the set of initial system states for the continuous subsystem and $X_u \subset R^n$ be a set of unsafe states for the continuous subsystem. The unsafe states may be unsafe because they violate the contract.

In some embodiments, a continuously differentiable function B: $R^n \rightarrow R$ may be a barrier certificate if it satisfies the first condition 705, the second condition 710 and the third condition 715 depicted in FIG. 7.

In some embodiments, the barrier certificate may be non-positive over the initial states of the continuous subsystem and positive over the unsafe states of the continuous subsystem.

In some embodiments, an unsafe state may include a state in which one or more contracts for a continuous subsystem are not satisfied for a situation that includes the one or more assumptions.

In some embodiments, if the continuous subsystem is unsafe, there may exist a continuous trajectory along which the barrier may increase. However, the third condition 715 depicted in FIG. 7 states that the function B never increases along a continuous flow, and so, the continuous subsystem must be safe. Indeed, the set $B(x) \leq 0$ may include a set that traps all the continuous flows of the system so that an unsafe condition may not be present.

In some embodiments, a safety condition may be expressed as the joint effect of a plurality of barrier certificates, e.g., $B_1(x) \leq 0 \hat{} \ldots \hat{} B_m(x) \leq 0$. For the purpose of clarity, this description assumes the case of a single barrier certificate, but those having ordinary skill in the art will appreciate the application of a plurality of barrier certificates based on this description.

FIGS. 8 and 9 assume one or more embodiments where a contract is given as a barrier certificate in accordance with the following conditions: (1) let B: $X \rightarrow X$ include a continuously differentiable function; (2) the initial conditions of the continuous subsystem are such that $B(x) \leq 0$; (3) whenever $\alpha(u, x) \geq 0$ and $B(x) \leq 0$, then $\gamma(u, y) \geq 0$ must be true; and (4) if $\alpha(u, x) \geq 0$, then the first differential equation 805 illustrated in FIG. 8 must be true.

In these embodiments it follows from the properties of the barrier certificate that the continuous subsystem will always satisfy its contract (and hence, the parametric modification module 208 is able to identify a set of options described by the options data 291 that will always satisfy the contract described by the hard constraint data 195 where the one or more assumptions described by the assumption data 193 are present). These conditions may be used to formulate the sixth optimization problem 810 depicted in FIG. 8. The sixth optimization problem is a static optimization problem, and not a dynamic optimization problem.

Referring now to FIG. 9. The implications included in the sixth optimization problem 810 may be replaced with sufficient conditions via one or more s-procedures as shown in the seventh optimization problem 905. In some embodiments, for one or more continuous subsystems included in the first vehicle model, the parametric modification module 208 may include code and routines operable to use the seventh optimization problem 905 to identify a set of options described by the options data 291 that will always satisfy the contract described by the hard constraint data 195 where the one or more assumptions described by the assumption data 193 are present.

In some embodiments, the universally quantified constraints may be replaced with sum-of-squares or semidefinite constraints for contracts having the form identified above for continuous subsystems.

Figure 10:
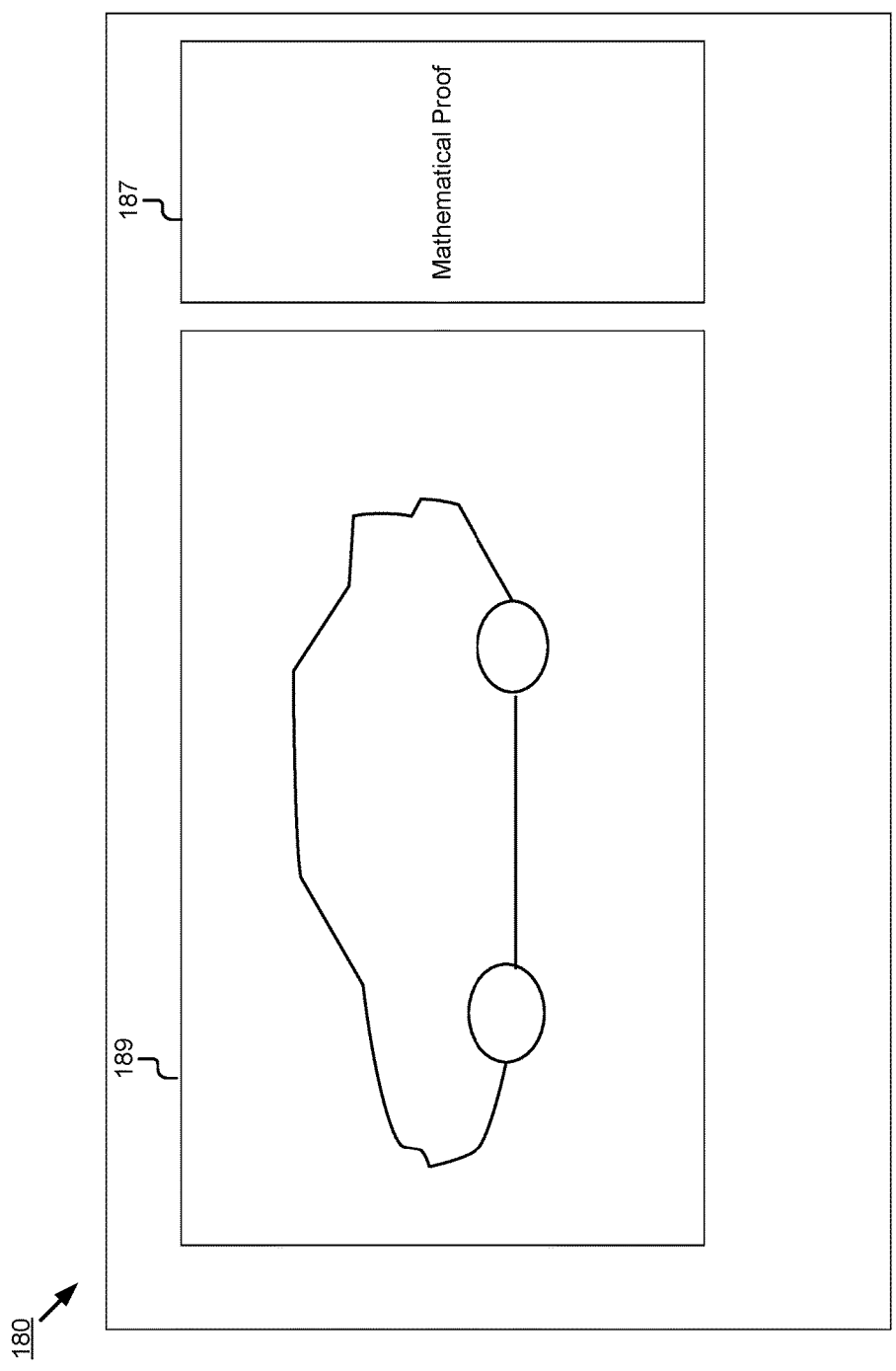
FIG. 10 includes an example graphical user interface that includes a modified vehicle model and a mathematical proof associated with the modified vehicle model according to some embodiments.

FIG. 10 is an example GUI 180 provided by the GUI generation system 199. The example GUI 180 may include a visual depiction of a modified vehicle model described by the modified vehicle model data 189 and a visual depiction of a mathematical proof described by the proof data 187. In some embodiments, the GUI 180 includes a second GUI as described above.

In some embodiments, the GUI 180 may include a first image of the modified vehicle model and a second image of the mathematical proof. The GUI 180 may display the first image and the second image in a side by side orientation as shown in FIG. 10.

In the above description, for purposes of explanation, numerous specific details are set forth in order to provide a thorough understanding of the specification. It will be apparent, however, to one skilled in the art that the disclosure can be practiced without these specific details. In some instances, structures and devices are shown in block diagram form in order to avoid obscuring the description. For example, the present implementations can be described above primarily with reference to user interfaces and particular hardware. However, the present implementations can apply to any type of computing device that can receive data and commands, and any peripheral devices providing services.

Reference in the specification to "some implementations" or "some instances" means that a particular feature, structure, or characteristic described in connection with the implementations or instances can be included in at least one implementation of the description. The appearances of the phrase "in some implementations" in various places in the specification are not necessarily all referring to the same implementations.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present implementations of the specification can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

The specification can take the form of some entirely hardware implementations, some entirely software implementations or some implementations containing both hardware and software elements. In some preferred implementations, the specification is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the specification as described herein.

The foregoing description of the implementations of the specification has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies, and other aspects are not mandatory or significant, and the mechanisms that implement the specification or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to implementation in any specific programming language, or for any specific operating system or environment. Accordingly, the disclosure is intended to be illustrative, but not limiting, of the scope of the specification, which is set forth in the following claims.

What is claimed is:

1. A method comprising:
building a first vehicle model for a real world vehicle based on vehicle parameter data describing a set of vehicle parameters that describe the real world vehicle, wherein a subset of vehicle parameters included in the set of vehicle parameters are included in a set of candidate parameters for parametric modification;
performing a reachability analysis to determine whether the first vehicle model satisfies each hard constraint included in a set of hard constraints, wherein the set of hard constraints are requirements that are satisfied for substantially all situations where the real world vehicle is being used for its intended purpose;
determining, based on the reachability analysis, that the first vehicle model does not satisfy each hard constraint included in the set of hard constraints for all the situations where the real world vehicle is being used for its intended purpose;
analyzing, by a processor, the set of candidate parameters for parametric modification to identify a set of options for modifying one or more of the vehicle parameters included in the set of vehicle parameters; and
generating a modified vehicle model that satisfies each hard constraint included in the set of hard constraints for all the situations where the real world vehicle is being used for its intended purpose.

2. A method comprising:
building a first vehicle model for a real world vehicle based on vehicle parameter data describing a set of vehicle parameters that describe the real world vehicle, wherein a subset of vehicle parameters included in the set of vehicle parameters are included in a set of candidate parameters for parametric modification;
performing a reachability analysis to determine whether the first vehicle model satisfies each hard constraint included in a set of hard constraints, wherein the set of hard constraints are requirements that are satisfied for substantially all situations where the real world vehicle is being used for its intended purpose and the set of hard constraints include a set of assumptions;
determining, based on the reachability analysis, that the first vehicle model does not satisfy each hard constraint included in the set of hard constraints for all the situations that include the set of assumptions;
analyzing, by a processor, the set of candidate parameters for parametric modification to identify a set of options for modifying one or more of the vehicle parameters included in the set of vehicle parameters; and
generating a modified vehicle model that satisfies each hard constraint included in the set of hard constraints for all the situations that include the set of assumptions.

3. The method of claim 2, further comprising:
providing a first graphical user interface that visually displays the set of options for modifying one or more of the vehicle parameters included in the set of vehicle parameters;
receiving an input from a user identifying a selected option from the set options visually displayed in the first graphical user interface; and
determining the modified vehicle model based on the selected option, wherein the modified vehicle model is configured to satisfy each hard constraint included in the set of hard constraints for all the situations that include the set of assumptions.

4. The method of claim 3, further comprising:
determining a mathematical proof that proves that the modified vehicle model is configured to satisfy each hard constraint included in the set of hard constraints for all the situations that include the set of assumptions; and
providing a second graphical user interface that visually displays the modified vehicle model and the mathematical proof.

5. The method of claim 3, wherein the set of assumptions includes the real world vehicle being used in a manner that is lawful.

6. The method of claim 3, wherein each hard constraint included in the set of hard constraints is a threshold that should not be exceeded.

7. The method of claim 4, wherein each first graphical user interface and the second graphical user interface are visually displayed on a monitor.

8. The method of claim 4, wherein the second graphical user interface visually displays the modified vehicle model and the mathematical proof at a same time.

9. The method of claim 3, wherein one of the options included in the set of options for modifying one or more of the vehicle parameters includes modifying a physical property of a hardware component included in the set of vehicle parameters.

10. The method of claim 9, wherein the physical property includes a stiffness of a suspension included in the set of vehicle parameters.

11. The method of claim 3, wherein one of the options included in the set of options for modifying one or more of the vehicle parameters includes modifying a hardware component and a software component included in the set of vehicle parameters.

12. The method of claim 3, wherein the method does not include a Monte-Carlo analysis.

13. The method of claim 3, wherein the method does not include a derivative of a Monte-Carlo analysis.

14. A non-transitory memory comprising computer code which, when executed by a processor, causes the processor to perform steps comprising:
building a first vehicle model for a real world vehicle based on vehicle parameter data describing a set of vehicle parameters that describe the real world vehicle, wherein a subset of vehicle parameters included in the set of vehicle parameters are included in a set of candidate parameters for parametric modification;
performing a reachability analysis to determine whether the first vehicle model satisfies each hard constraint included in a set of hard constraints, wherein the set of hard constraints are requirements that are satisfied for substantially all situations where the real world vehicle is being used for its intended purpose and the set of hard constraints include a set of assumptions;
determining, based on the reachability analysis, that the first vehicle model does not satisfy each hard constraint included in the set of hard constraints for all the situations that include the set of assumptions;
analyzing, by a processor, the set of candidate parameters for parametric modification to identify a set of options for modifying one or more of the vehicle parameters included in the set of vehicle parameters; and generating a modified vehicle model that satisfies each hard constraint included in the set of hard constraints for all the situations that include the set of assumptions.

15. The non-transitory memory of claim 14, wherein a first one of the options included in the set of options for modifying one or more of the vehicle parameters includes modifying a hardware component included in the set of vehicle parameters and a second one of the options included in the set of options for modifying one or more of the vehicle parameters includes modifying a software component included in the set of vehicle parameters.

16. The non-transitory memory of claim 14, wherein the steps do not include a Monte-Carlo analysis.

17. The non-transitory memory of claim 14, wherein the steps do not include a derivative of a Monte-Carlo analysis.

18. The non-transitory memory of claim 14, wherein the real world vehicle is an autonomous vehicle.

19. The non-transitory memory of claim 14, wherein one or more of the set of hard constraints is defined by a governmental regulation.

20. The non-transitory memory of claim 14, wherein one or more of the set of hard constraints is defined by a standard approved by a standards organization.

21. The non-transitory memory of claim 14, wherein the steps further comprise:
providing a first graphical user interface that visually displays the set of options for modifying one or more of the vehicle parameters included in the set of vehicle parameters;
receiving an input from a user identifying a selected option from the set options visually displayed in the first graphical user interface;
determining the modified vehicle model based on the selected option, wherein the modified vehicle model is configured to satisfy each hard constraint included in the set of hard constraints for all the situations that include the set of assumptions; and
providing a second graphical user interface that visually displays the modified vehicle model.

22. The non-transitory memory of claim 21, wherein the steps further comprise determining a mathematical proof that proves that the modified vehicle model is configured to satisfy each hard constraint included in the set of hard constraints for all the situations that include the set of assumptions, and wherein the second graphical user interface visually displays a first image that depicts the modified vehicle model and a second image that depicts the mathematical proof.

23. The non-transitory memory of claim 22, wherein the second graphical user interface visually displays the first image and the second image at the same time.

24. The non-transitory memory of claim 23, wherein the second graphical user interface visually displays the first image and the second image in a side by side orientation.

25. The non-transitory memory of claim 23, wherein the set of options is not generated by randomly sampling different parameter combinations to identify the set of options whose implementation would result in the modified vehicle model that would satisfy each hard constraint included in the set of hard constraints for all the situations that include the set of assumptions.

\* \* \* \* \*